(12) United States Patent
Mårtensson et al.

(10) Patent No.: US 7,897,247 B2
(45) Date of Patent: Mar. 1, 2011

(54) COATED CUTTING TOOL INSERT

(75) Inventors: Per Mårtensson, Nacka (SE); Per Gustafson, Huddinge (SE)

(73) Assignee: Sandvik Intellectual Property AB, Sandviken (SE)

( * ) Notice: Subject to any disclaimer, the term of this patent is extended or adjusted under 35 U.S.C. 154(b) by 991 days.

(21) Appl. No.: 11/601,845

(22) Filed: Nov. 20, 2006

(65) Prior Publication Data

US 2007/0134517 A1    Jun. 14, 2007

(30) Foreign Application Priority Data

Nov. 21, 2005    (SE) ................. 0502553-1

(51) Int. Cl.
*B32B 9/00* (2006.01)

(52) U.S. Cl. ............... 428/216; 51/307; 51/309; 428/325; 428/336; 428/472; 428/698; 428/701; 428/702; 427/419.1; 427/419.2; 427/419.7

(58) Field of Classification Search ............ 51/307, 51/309; 428/216, 325, 336, 472, 698, 701, 428/702; 427/419.1, 419.2, 419.7
See application file for complete search history.

(56) References Cited

U.S. PATENT DOCUMENTS

| | | | |
|---|---|---|---|
| 5,654,035 A | 8/1997 | Ljungberg et al. | |
| 5,766,782 A | 6/1998 | Ljungberg | |
| 5,851,687 A | 12/1998 | Ljungberg | |
| 5,861,210 A * | 1/1999 | Lenander et al. | ............ 428/702 |
| 5,863,640 A | 1/1999 | Ljungberg et al. | |
| 5,945,207 A * | 8/1999 | Kutscher et al. | ............ 428/216 |
| 6,221,479 B1 * | 4/2001 | Waldenstrom et al. | ...... 428/701 |
| 6,333,098 B1 * | 12/2001 | Olsson et al. | ............... 428/698 |
| 6,682,274 B2 * | 1/2004 | Votsch et al. | ................ 407/118 |
| 7,150,772 B2 * | 12/2006 | Larsson et al. | ................ 51/309 |
| 7,153,562 B2 * | 12/2006 | Rodmar et al. | ............ 428/336 |
| 7,232,603 B2 * | 6/2007 | Hessman | .................... 428/325 |

FOREIGN PATENT DOCUMENTS

| | | |
|---|---|---|
| EP | 0 753 603 B1 | 1/1997 |
| EP | 1 455 003 A2 | 9/2004 |
| EP | 1 493 845 A1 | 1/2005 |
| WO | 98/10119 | 3/1998 |

* cited by examiner

*Primary Examiner*—Archene Turner
(74) *Attorney, Agent, or Firm*—Drinker Biddle & Reath LLP

(57) ABSTRACT

The present invention discloses coated cutting tool inserts particularly useful for turning of nodular cast iron preferably at high speeds, comprising a cemented carbide substrate comprising from about 5 to about 9 wt-% Co and from about 1 to about 5 wt % cubic carbides and balance WC of 86-94 wt-%, and a coating comprising a first layer of $TiC_xN_yO_z$ with equiaxed grains, a layer of $TiC_xN_yO_z$ with a thickness of less than about 10 to about 15 μm with columnar grains, a layer of $TiC_xN_yO_z$ with a thickness of from about 0.1 to about 2 μm and with equiaxed or plate-like grains, a layer of $\alpha$-$Al_2O_3$ with thickness from about 3 to about 8 μm, an outer layer of a multilayered structure of TiN+TiC with TiC being the outermost layer and a total thickness of from about 0.5 to about 2 μm and wherein the outer coating layer has been removed in the edge line and on the rake face so that the $\alpha$-$Al_2O_3$ layer is on top along the cutting edge line and on the rake face and the outer TiC layer is the top layer on the flank face.

20 Claims, 1 Drawing Sheet

COATED CUTTING TOOL INSERT

BACKGROUND OF THE INVENTION

The present invention relates to coated cutting tool inserts particularly useful for machining of nodular cast iron parts by turning at high speeds.

Cast iron materials may be divided into two main categories, grey cast iron and nodular cast iron. Nodular cast iron is considered to be a comparatively difficult material to machine. Cast irons often have an outer layer of cast skin, which may contain various inclusions of sand, rust and other impurities, and also have a surface zone which is decarburized and contains a higher amount of ferrite than the rest of the material. In addition, machining of nodular cast iron causes so called adhesive wear to $Al_2O_3$-coated cutting tools as well as higher levels of abrasive wear. Adhesive wear occurs when fragments or individual grains of the coating layer are pulled away from the cutting edge by the work piece chip formed. Flaking of this kind, close to the edge line, eventually results in a local break through of the coating layer leading to an accelerated chemical wear and shorter tool life.

Another critical factor when machining nodular cast iron at high speeds with or without the use of coolant is the formation of excess heat at the cutting edge causing a softening of the inserts leading to plastic deformation and flaking of the coating with accelerated wear as a consequence.

U.S. Pat. No. 5,863,640 discloses a coated cutting insert consisting of a cemented carbide body of a composition 5-11 wt-% Co, <10 wt-% cubic carbides of the metals Ti, Ta and/or Nb and balance WC, and a coating comprising an innermost 0.1-2 μm $TiC_xN_yO_z$ layer, a 2-15 μm $TiC_xN_yO_z$ layer, a 0.1-2 μm $TiC_xN_yO_z$ layer, a 2-10 μm α-$Al_2O_3$ layer, especially suited for machining of low alloyed steel components by turning.

U.S. Pat. No. 5,945,207 discloses a coated cutting tool insert with a WC—Co based substrate with <0.5 wt-% cubic carbides and a coating comprising an innermost 0.1-2 μm $TiC_xN_yO_z$ layer, a 5-10 μm $TiC_xN_y$ layer, a 0.1-2 μm $TiC_xN_yO_z$ layer, a 3-6 μm α-$Al_2O_3$ layer, and an outer layer of $TiC_xN_yO_z$ a 0.5-3 μm layer or a multilayer of a 0.5-3 μm thick TiN+TiC+TiN sequence, particularly useful for machining of cast iron.

OBJECTS AND SUMMARY OF THE INVENTION

It is an object of the present invention to provide coated cutting tool inserts, particularly useful for turning of nodular cast iron, preferably at high cutting speeds.

In one aspect of the invention, there is provide a cutting tool insert comprising a coating and a cemented carbide body, said cemented carbide body comprises from about 5 to about 9 wt-% Co, and from about 1 to about 5 wt-% cubic carbides of the metals Ta and Nb, the Ti content in the composition corresponding to technical impurity, and balance WC of from about 86 to about 94 wt-%, said body having a coercivity of from about 19.5 to about 24.5 kA/m, and said coating comprises a first innermost layer of $TiC_xN_yO_z$ with x+y+z=1 and y>x and z less than about 0.1 with a thickness of from about 0.1 to about 2 μm, and with equiaxed grains with size less than about 0.5 μm, a layer of $TiC_xN_yO_z$ where x+y+z=1, with a thickness of more than about 10 to about 15 μm, with columnar grains, a layer of $TiC_xN_yO_z$ where x+y+z=1, z<0.5 and x>y with a thickness of from about 0.1 to about 2 μm and with equiaxed or plate-like grains with size less than about 0.5 μm, a layer of smooth, fine-grained, textured α-$Al_2O_3$ with a thickness from about 3 to about 8 μm, and a grain size of from about 0.5 to about 2 μm, an outer layer of a multilayered structure of TiN+TiC in one or several sequences with TiC being the outermost layer and a total thickness of from about 0.5 to about 2 μm, the outer coating layer being removed in the edge line and on the rake face so that the $Al_2O_3$ layer is on top along the cutting edge line and on the rake face and the outer TiC layer is the top layer on the flank face.

In another aspect of the invention, there is provided a method of making a cutting tool insert comprising a cemented carbide body and a coating wherein the cemented carbide body has a composition comprising from about 5 to about 9 wt-% Co, from about 1 to about 5 wt-% cubic carbides of the metals Ta and Nb, the Ti content in the composition corresponding to technical impurity, and balance WC of from about 86 to about 94 wt-%, with a coercivity of from about 19.5 to about 24.5 kA/m by mixing of powders, ball milling, spray-drying, pressing and sintering, coating the body with a first, innermost, layer of $TiC_xN_yO_z$ with a thickness of from about 0.1 to about 2 μm, with equiaxed grains with size less than about 0.5 μm using CVD-methods, a layer of $TiC_xN_yO_z$ with a thickness of more than about 10 to about 15 μm, with columnar grains and with a diameter of less than about 5 μm deposited by MTCVD-technique, using acetonitrile as the carbon and nitrogen source for forming the layer, a layer of $TiC_xN_yO_z$ with a thickness of from about 0.1 to about 2 μm with equiaxed or plate-like grains with size less than about 0.5 μm, using CVD-methods, a layer of a smooth, fine-grained, textured α-$Al_2O_3$ with a thickness of from about 3 to about 8 μm and a grain size of from about 0.5 to about 2 μm using CVD-methods, an outer layer of a multilayered structure of TiN+TiC in one or several sequences with TiC being the outermost layer and a total thickness of from about 0.5 to about 2 μm using CVD-methods, and removing the outer layer of a multilayered structure of TiN+TiC so that the α-$Al_2O_3$ layer is exposed and smoothened along the cutting edge line and on the rake face, leaving the outermost TiC layer essentially unaffected on the flank face of the cutting insert.

In a still further aspect of the invention, there is provided the use of a cutting tool insert as described above for the turning of cast irons at a cutting speed of from about 250 to about 550 m/min and a feed of from about 0.10 to about 0.35 mm/rev depending on cutting speed and insert geometry.

DETAILED DESCRIPTION OF THE PREFERRED EMBODIMENTS

Figure 1:
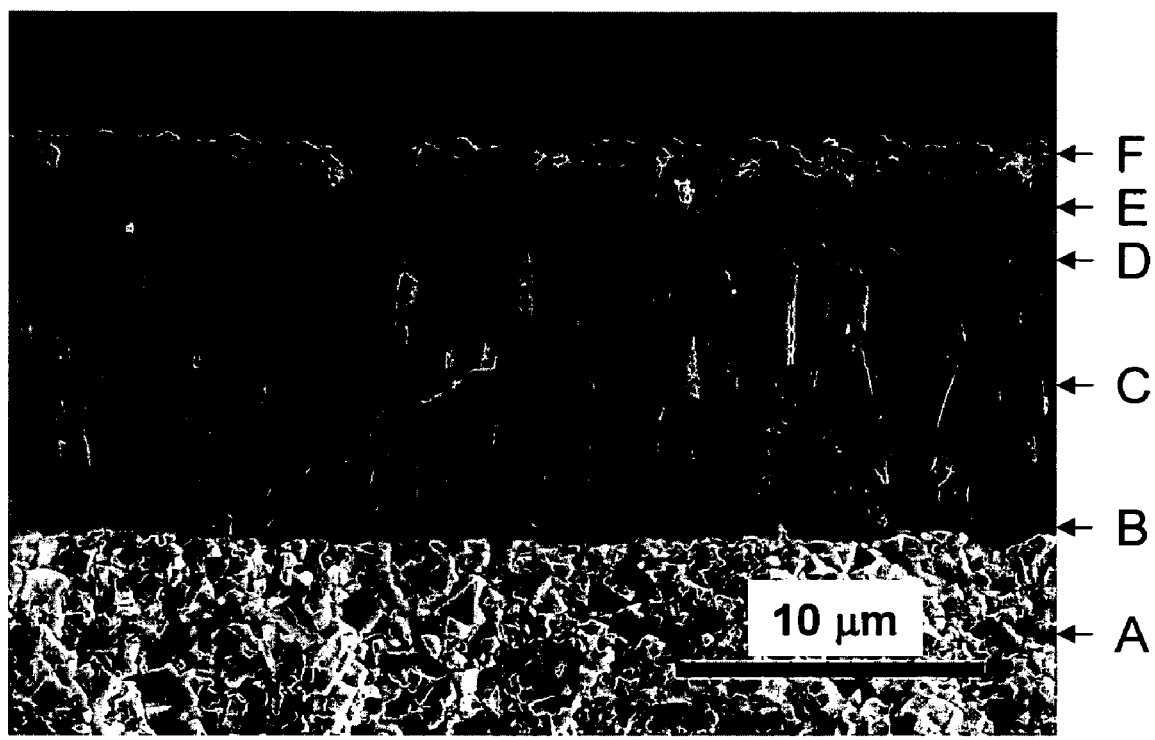
FIG. 1 is a micrograph of a coated insert according to the present invention in which
 A—cemented carbide body
 B—$TiC_xN_yO_z$ bonding layer
 C—$TiC_xN_yO_z$ layer with columnar grains
 D—$TiC_xN_yO_z$ bonding layer
 E—textured α-$Al_2O_3$-layer
 F—TiN+TiC multilayer.

It has now surprisingly been found that cutting tool inserts having improved properties with respect to the wear types prevailing at the above mentioned cutting operation can be obtained with cutting tool inserts comprising: a cemented carbide body with a low content of cubic carbides, a thick columnar $TiC_xN_yO_z$-layer, a thick textured α-$Al_2O_3$-layer, a top flank face layer of a TiN+TiC multilayer, TiC being the outermost layer, and a wet blasted α-$Al_2O_3$ rake face and edge line layer.

According to the present invention, there is provided a cutting tool insert comprising a cemented carbide body and a coating, wherein the cemented carbide body has a composition of from about 5 to about 9 wt-%, preferably from about 6 to about 8 wt-%, most preferably from about 6.5 to about 7.1 wt-%, Co, from about 1 to about 5 wt-%, preferably from about 2 to about 4 wt-%, most preferably from about 2.6 to about 3.4 wt-% cubic carbides of the metals Ta and Nb, the TaC content is preferably from about 2 to about 3 wt-%, most preferably from about 2.4 to about 3.0 wt-% and the NbC content is preferably from about 0.20 to about 0.35 wt-%, most preferably from about 0.27 to about 0.33 wt-%, the Ti content in the composition corresponds to technical impurity, and balance WC of from about 86 to about 94 wt-%, preferably from about 88 to about 92 wt-%, most preferably from about 89.5 to about 90.6 wt-%. The coercivity of the cemented carbide body is from about 19.5 to about 24.5 kA/m, corresponding to an average grain size of from about 0.7 to about 1.5 µm.

The coating comprises
a first, innermost, layer of $TiC_xN_yO_z$ with x+y+z=1, preferably y>x and z is less than about 0.1, most preferably y is greater than about 0.8 and z=0, with a thickness of from about 0.1 to about 2 µm, and with equiaxed grains with size less than about 0.5 µm.
a layer of $TiC_xN_yO_z$ with x+y+z=1, preferably with z=0, x is greater than about 0.3 and y is greater than about 0.3, most preferably x is greater than about 0.5, with a thickness of more than about 10 to about 15 µm, most preferably from about 11 to about 13 µm with columnar grains
a layer of $TiC_xN_yO_z$, x+y+z=1 with z is less than about 0.5, preferably x>y, most preferably x is greater than about 0.5 and z is greater than about 0.1 but less than about 0.4, with a thickness of from about 0.1 to about 2 µm and with equiaxed or plate-like grains with size less than about 0.5 µm, this layer being the same as or different from the innermost layer,
a layer of smooth, fine-grained, textured $\alpha$-$Al_2O_3$ with a thickness of from about 3 to about 8 µm, preferably from about 3 to about 6 µm, and a grain size of from about 0.5 to about 2 µm,
an outer layer of a multilayered structure of TiN+TiC in one or several sequences with TiC being the outermost layer having a total thickness of from about 0.5 to about 2 µm, preferably from about 0.7 to about 1.3 µm and further having a preferred grain size less than about 1 µm.

The outer coating layer is removed in the edge line and on the rake face so that the $\alpha$-$Al_2O_3$ layer is on top along the cutting edge line and on the rake face and the outer TiC layer is the top layer on the flank face. The coated insert thus has a smooth $\alpha$-$Al_2O_3$ surface on the edge line and the rake face, preferably with a surface roughness of $R_{max} \leq 0.4$ µm over a length of 10 µm, and a bright grey color on the flank face. The bright grey top coating facilitates the easy identification of used edges.

Furthermore, as disclosed in U.S. Pat. No. 5,654,035, U.S. Pat. No. 5,851,687 or U.S. Pat. No. 5,766,782, each of which is herein incorporated by reference in their entireties, the $\alpha$-$Al_2O_3$-layer has a preferred crystal growth orientation in either the (104)-, (012)- or (110)-direction, preferably in the (012)-direction, as determined by X-ray Diffraction (XRD) measurements. A Texture Coefficient, TC, being defined as:

$$TC(hkl) = \frac{I(hkl)}{I_O(hkl)} \left\{ \frac{1}{n} \sum \frac{I(hkl)}{I_O(hkl)} \right\}^{-1}$$

where
I(hkl)=measured intensity of the (hkl) reflection
$I_O$(hkl)=standard intensity of the ASTM standard powder pattern diffraction data according to card no 43-1484
n=number of reflections used in the calculation, (hkl) reflections used are: (012), (104), (110), (113), (300), (116)

The TC for one of the set of (012), (104) or (110) crystal planes should be larger than about 1.3, preferably larger than about 1.5.

The present invention also relates to a method of making the above mentioned coated cutting tool insert comprising a cemented carbide body of a composition from about 5 to about 9 wt-%, preferably from about 6 to about 8 wt-%, most preferably from about 6.5 to about 7.1 wt-%, Co, from about 1 to about 5 wt-%, preferably from about 2 to about 4 wt-%, most preferably from about 2.6 to about 3.4 wt-% cubic carbides of the metals Ta and Nb, the TaC content is preferably from about 2 to about 3 wt-%, most preferably from about 2.4 to about 3.0 wt-% and the NbC content is preferably from about 0.20 to about 0.35 wt-%, most preferably from about 0.27 to about 0.33 wt-%, the Ti content in the composition corresponds to technical impurity, and balance WC of from about 86 to about 94 wt-%, preferably from about 88 to about 92 wt-%, most preferably from about 89.5 to about 90.6 wt-%, having a coercivity of from about 19.5 to about 24.5 kA/m, corresponding to an average grain size of approximately from about 0.7 to about 1.5 µm.

The cemented carbide body is mainly produced by mixing of powders, ball milling, spray-drying, some pressing method followed by sintering according to conventional methods.

The insert is then coated with
a first, innermost, layer of $TiC_xN_yO_z$ with x+y+z=1, preferably y>x and z is less than about 0.1, most preferably y is greater than about 0.8 and z=0, with a thickness of from about 0.1 to about 2 µm, and with equiaxed grains with size less than about 0.5 µm.
a layer of $TiC_xN_yO_z$ x+y+z=1, preferably with z=0, x is greater than about 0.3 and y is greater than about 0.3, most preferably x is greater than about 0.5, with a thickness more than about 10 to about 15 µm, preferably from about 11 to about 13 µm with columnar grains, deposited preferably by MTCVD-technique (using acetonitrile as the carbon and nitrogen source for forming the layer in the temperature range of from about 700 to about 900° C.). The exact conditions, however, depend to a certain extent on the design of the equipment used and can be determined by the skilled artisan.
a layer of $TiC_xN_yO_z$, x+y+z=1 with z is less than about 0.5, preferably x>y, most preferably x is greater than about 0.5 and z is greater than about 0.1 but is less than 0.4, with a thickness of from about 0.1 to about 2 µm and with equiaxed or plate-like grains with size less than about 0.5 µm, using known CVD-methods this layer being the same as or different from the innermost layer.
an intermediate layer of a smooth, fine-grained, textured $\alpha$-$Al_2O_3$ according to U.S. Pat. No. 5,654,035, U.S. Pat. No. 5,851,687 or U.S. Pat. No. 5,766,782 with a thickness of from about 3 to about 8 µm, preferably from about 3 to about 6 µm and a preferred grain size of from about 0.5 to about 2 µm.
an outer layer of a multilayered structure of TiN+TiC in one or several sequences with TiC being the outermost layer and a total thickness of from about 0.5 to about 2 µm, preferably from about 0.7 to about 1.3 µm. This layer preferably exhibits a grain size less than about 1 µm.

In order to obtain a smooth cutting edge line with increased toughness, the coated insert is subjected to a wet blasting treatment using $Al_2O_3$ grit at a high enough pressure to remove the top TiN+TiC multilayer giving a smooth surface of the edge line and the rake face of the insert while leaving the bright grey colored outermost TiC layer on the flank face essentially unaffected thus facilitating easy identification of used edges.

When a $TiC_xN_yO_z$-layer with $z>0$ is desired, $CO_2$ and/or CO are/is added to the reaction gas mixture.

The invention also relates to the use of cutting tool inserts according to above for turning under dry conditions of grey cast iron and nodular iron with or without cast skin, at a cutting speed of from about 250 to about 550 m/min and a feed of from about 0.10 to about 0.35 mm/rev depending on cutting speed and insert geometry.

The invention is additionally illustrated in connection with the following examples, which are to be considered as illustrative of the present invention. It should be understood, however, that the invention is not limited to the specific details of the examples.

Example 1

A. Cemented carbide cutting tool inserts of style CNMG 120412-KM with the composition 6.8 wt-% Co, 2.7 wt-% TaC, 0.3 wt-% NbC and balance made up by WC with an average grain size of 1 µm, measured according to Jeffries method, were coated with a 0.5 µm equiaxed $TiC_xN_y$-layer, $x=0.1$, $y=0.9$, and an average grain size of about 0.2 µm, followed by a 12.0 µm thick $TiC_xN_y$-layer $x=0.55$, $y=0.45$, with columnar grains, by using MTCVD-technique (process temperature 885° C. and $CH_3CN$ as the carbon/nitrogen source). In subsequent process steps during the same coating cycle, a 1 µm thick layer of $TiC_xN_yO_z$ with $x=0.6$, $y=0.2$ and $z=0.2$, with equiaxed grains and an average grain size of 0.2 µm was deposited followed by a 5.0 µm thick layer of (012)-textured $\alpha$-$Al_2O_3$, with TC(012)=1.81 and an average grain size of about 1.2 µm, deposited according to conditions given in U.S. Pat. No. 5,654,035. On top of the $\alpha$-$Al_2O_3$ layer, TiN+TiC+TiN+TiC was deposited in a multilayer structure with a total coating thickness of 1.5 µm and average grain size<0.3 µm in each individual layer. Finally, the inserts were subjected to a wet blasting treatment during which the top TiN+TiC multilayer structure was removed from the cutting edge lines and rake face and during the same operation the $Al_2O_3$ layer was smoothened.

B. Cemented carbide cutting tool inserts of style CNMG 120412-KM with the composition 6.8 wt-% Co, 2.7 wt-% TaC, 0.3 wt-% NbC and balance made up by WC were coated with a 0.5 µm equiaxed $TiC_xN_y$-layer, $x=0.1$, $y=0.9$, and an average grain size of about 0.2 µm, followed by a 12.0 µm thick TiCxNy-layer $x=0.55$, $y=0.45$, with columnar grains, by using MTCVD-technique (process temperature 885° C. and $CH_3CN$ as the carbon/nitrogen source). In subsequent process steps during the same coating cycle, a 1 µm thick layer of $TiC_xN_yO_z$, with $x=0.6$, $y=0.2$ and $z=0.2$, with equiaxed grains and an average grain size of 0.2 µm was deposited followed by a 5.0 µm thick layer of (012)-textured $\alpha$-$Al_2O_3$, with TC(012)=1.93 and an average grain size of about 1.2 µm, deposited according to conditions given in U.S. Pat. No. 5,654,035. On top of the $\alpha$-$Al_2O_3$ layer, TiN+TiC+TiN+TiC was deposited in a multilayer structure with a total coating thickness of 1.5 µm and average grain size<0.3 µm in each individual layer. Finally, the inserts were subjected to a brushing treatment in which the cutting edge lines were smoothed with a 320 mesh brush containing SiC as grinding material, the outer TiN+TiC multilayer structure was removed by the brushing treatment along the cutting edge line.

C. Cemented carbide cutting tool inserts of style CNMG 120412-KM with the composition 6.8 wt-% Co, 2.7 wt-% TaC, 0.3 wt-% NbC and balance made up by WC were coated with a 0.5 µm equiaxed $TiC_xN_y$-layer, $x=0.1$, $y=0.9$, and an average grain size of about 0.2 µm, followed by a 5.0 µm thick $TiC_xN_y$-layer $x=0.55$, $y=0.45$, with columnar grains, by using MTCVD-technique (process temperature 885° C. and $CH_3CN$ as the carbon and nitrogen source). In subsequent process steps during the same coating cycle, a 1 µm thick layer of $TiC_xN_yO_z$, with $x=0.6$, $y=0.2$ and $z=0.2$, with equiaxed grains and an average grain size of 0.2 µm was deposited followed by a 4.0 µm thick layer of (012)-textured $\alpha$-$Al_2O_3$, with TC(012)=1.85 and an average grain size of about 1.2 µm, deposited according to conditions given in U.S. Pat. No. 5,654,035. Finally, the inserts were subjected to a wet blasting treatment during which the $Al_2O_3$ layer was smoothened.

D. Cemented carbide cutting tool inserts of style CNMG 120412-KM with the composition 6.0 wt-% Co and balance WC were coated with a 0.5 µm equiaxed $TiC_xN_yO_z$ layer, $x=0.1$, $y=0.9$, $z=0$ and an average grain size of about 0.2 µm, followed by a 8.0 µm thick $TiC_xN_y$ layer $x=0.55$, $y=0.45$, with columnar grains, by using MTCVD-technique (process temperature 850° C. and $CH_3CN$ as the carbon and nitrogen source). In subsequent process steps during the same coating cycle, a 1 µm thick layer of $TiC_xN_yO_z$, with $x=0.6$, $y=0.2$ and $z=0.2$, with equiaxed grains and an average grain size of 0.2 µm was deposited followed by a 5.0 µm thick layer of (012)-textured $\alpha$-$Al_2O_3$, with TC(012)=1.90 and an average grain size of about 1.2 µm, deposited according to conditions given in U.S. Pat. No. 5,654,035. On top of the $\alpha$-$Al_2O_3$ layer, TiN+TiC+TiN+TiC+TiN was deposited in a multilayer structure with a total coating thickness of 1.5 µm and average grain size<0.3 µm in each individual layer. Finally, the inserts were subjected to a brushing treatment in which the cutting edge lines were smoothed with a 320 mesh brush containing SiC as grinding material, the outer TiN+TiC multilayer structure was removed by the brushing treatment along the cutting edge line.

The inserts were tested in a facing operation. The work piece material was nodular cast iron, SS727. The work piece shape causes intermittent cutting conditions during each revolution. Cutting speed was 250 m/min, feed 0.10 mm/rev and cutting depth 2.0 mm. The operation was performed using coolant.

This type of operation typically causes severe flaking of the coating. The coating is torn off the insert in fragments. The wear can be measured as the part of the edge line on which the coating has flaked off compared to the total length of the edge line used in the cutting operation.

| Insert type | % of edge line with flaking |
| --- | --- |
| A (invention) | <5 |
| B (outside invention) | 20 |
| C (outside invention) | <5 |
| D (prior art) | 15 |

Example 2

The inserts in Example 1 above were tested in an intermittent cutting operation in grey cast iron, SS0125. The cutting conditions put high demands on the flaking resistance of the coating as well as the chemical and abrasive wear resistance of the coating. The shaping of the work piece is such that for each revolution two entrances in the work piece will be made giving intermittent cutting conditions. The cutting speed was 300 m/min, the cutting feed 0.25 mm/rev and the cutting depth 2.0 mm. The machining was made without using any coolant.

| Insert type | number of passes before the edge was worn out |
| --- | --- |
| A (invention) | 88 |
| B (outside invention) | 85 |
| C (outside invention) | 60 |
| D (prior art) | 70 |

Example 3

The inserts in example 1 above were tested in a turning test that causes deformation of the cutting edge leading to flaking of the coating and enhanced wear of the insert. The test was performed in a nodular cast iron SS0737 and for a certain combination of feed and cutting depth in a longitudinal turning operation. The highest possible cutting speed before deformation of the cemented carbide occurs was sought.

| Insert type | Highest possible cutting speed, m/min |
| --- | --- |
| A (invention) | 550 |
| B (outside invention) | 525 |
| C (outside invention) | 475 |
| D (prior art) | 425 |

Example 4

The inserts in Example 1 above were tested in an continuous cutting operation in nodular cast iron, SS0727. The cutting conditions put very high demands on the chemical and abrasive wear resistance of the coating. Cutting speed was 350 m/min, feed 0.30 mm/rev and cutting depth 2.0 mm. The operation was performed using coolant.

| Insert type | number of passes before the edge was worn out |
| --- | --- |
| A (invention) | 57 |
| B (outside invention) | 54 |
| C (outside invention) | 23 |
| D (prior art) | 38 |

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. A cutting tool insert comprising a coating and a cemented carbide body, said cemented carbide body comprises from about 5 to about 9 wt-% Co, and from about 1 to about 5 wt-% cubic carbides of the metals Ta and Nb, the Ti content in the composition corresponding to technical impurity, and balance WC of from about 86 to about 94 wt-%, said body having a coercivity of from about 19.5 to about 24.5 kA/m, and said coating comprises a first innermost layer of $TiC_xN_yO_z$ with $x+y+z=1$ and $y>x$ and z is less than about 0.1 with a thickness of from about 0.1 to about 2 μm, and with equiaxed grains with size is less than about 0.5 μm, a layer of $TiC_xN_yO_z$ where $x+y+z=1$, with a thickness of more than about 10 to about 15 μm, with columnar grains, a layer of $TiC_xN_yO_z$ where $x+y+z=1$, z is less than about 0.5 and $x>y$ with a thickness of from about 0.1 to about 2 μm and with equiaxed or plate-like grains with size less than about 0.5 μm, a layer of smooth, fine-grained, textured $\alpha$-$Al_2O_3$ with a thickness from about 3 to about 8 μm, and a grain size of from about 0.5 to about 2 μm, an outer layer of a multilayered structure of TiN+TiC in one or several sequences with TiC being the outermost layer and a total thickness of from about 0.5 to about 2 μm, the outer coating layer being removed in the edge line and on the rake face so that the $Al_2O_3$ layer is on top along the cutting edge line and on the rake face and the outer TiC layer is the top layer on the flank face.

2. The cutting insert of claim 1 wherein the cemented carbide body comprises from about 6 to about 8 wt-% Co, from about 2 to about 4 wt-% cubic carbides, the TaC content is from about 2 to about 3 wt-%, the NbC content is from about 0.2 to about 0.35 wt-% and WC is present in an amount of from about 88 to about 92 wt-%.

3. The cutting insert of claim 2 wherein the cemented carbide body comprises from about 6.5 to about 7.1 wt-% Co, from about 2.6 to about 3.4 wt-% cubic carbides, the TaC content is from about 2.4 to about 3.0 wt-% and the NbC content is from about 0.27 to about 0.33 wt-%.

4. The cutting insert of claim 1 wherein in said layer of $TiC_xN_yO_z$ with columnar grains, $z=0$, x is greater than about 0.3 and y is greater than about 0.3 and that layer has a thickness of from about 11 to about 13 μm.

5. The cutting insert of claim 1 wherein the layer of smooth, fine-grained, textured $\alpha$-$Al_2O_3$ has a thickness of from about 3 to about 6 μm.

6. The cutting insert of claim 1 wherein the outer layer has a total thickness of from about 0.7 to about 1.3 μm.

7. The cutting insert of claim 1 wherein the cemented carbide body comprises from about 6 to about 8 wt-% Co, from about 2 to about 4 wt-% cubic carbides, the TaC content is from about 2 to about 3 wt-%, the NbC content is from about 0.2 to about 0.35 wt-% and WC is present in an amount of from about 88 to about 92 wt-% in said layer of $TiC_xN_yO_z$ with columnar grains, $z=0$, x is greater than about 0.3 and y is greater than about 0.3 and that layer has a thickness of from about 11 to about 13 μm; the layer of smooth, fine-grained, textured $\alpha$-$Al_2O_3$ has a thickness of from about 3 to about 6 μm; and the outer layer has a total thickness of from about 0.7 to about 1.3 μm.

8. The cutting insert of claim 1 wherein the $\alpha$-$Al_2O_3$ layer has a texture coefficient in one of the set of crystal planes (012), (104) or (110) larger than 1.3.

9. The cutting insert of claim 8 wherein the texture coefficient TC(012), TC(104) or TC(110) is larger than 1.5.

10. The cutting insert of claim 1 wherein the first, innermost, layer of $TiC_xN_yO_z$ has the composition $z=0$ and y is greater than about 0.8.

11. The method of using a cutting tool insert of claim 1, wherein the cutting tool is used for turning cast irons at a cutting speed of from about 250 to about 550 m/min and a feed of from about 0.10 to about 0.35 mm/rev depending on cutting speed and insert geometry.

12. A method of making a cutting tool insert comprising a cemented carbide body and a coating wherein the cemented carbide body has a composition comprising from about 5 to about 9 wt-% Co, from about 1 to about 5 wt-% cubic carbides of the metals Ta and Nb, the Ti content in the composition corresponding to technical impurity, and balance WC of from about 86 to about 94 wt-%, with a coercivity of from about 19.5 to about 24.5 kA/m by mixing of powders, ball milling, spray-drying, pressing and sintering, coating the body with a first, innermost, layer of $TiC_xN_yO_z$ with a thickness of from about 0.1 to about 2 µm, with equiaxed grains with size less than about 0.5 µm using CVD-methods, a layer of $TiC_xN_yO_z$ with a thickness of more than about 10 to about 15 µm, with columnar grains and with a diameter of less than about 5 µm deposited by MTCVD-technique, using acetonitrile as the carbon and nitrogen source for forming the layer, a layer of $TiC_xN_yO_z$ with a thickness of from about 0.1 to about 2 µm with equiaxed or plate-like grains with size less than about 0.5 µm, using CVD-methods, a layer of a smooth, fine-grained, textured $\alpha$-$Al_2O_3$ with a thickness of from about 3 to about 8 µm and a grain size of from about 0.5 to about 2 µm using CVD-methods, an outer layer of a multilayered structure of TiN+TiC in one or several sequences with TiC being the outermost layer and a total thickness of from about 0.5 to about 2 µm, using CVD-methods, and removing the outer layer of a multilayered structure of TiN+TiC so that the $\alpha$-$Al_2O_3$ layer is exposed and smoothened along the cutting edge line and on the rake face, leaving the outermost TiC layer essentially unaffected on the flank face of the cutting insert.

13. The method of claim 12 wherein the $TiC_xN_yO_z$ layer with columnar grains is deposited by MTCVD is deposited at a temperature of from about 850 to about 900° C.

14. The method of claim 12 wherein the outer layer deposited by using CVD-methods is from about 0.7 to about 1.3 µm thick.

15. The method of claim 12 wherein the $\alpha$-$Al_2O_3$ layer has a texture coefficient in one of the set of crystal planes (012), (104) or (110) larger than 1.3.

16. The method of claim 15 wherein the texture coefficient TC(012), TC(104) or TC(110) is larger than 1.5.

17. The method of claim 12 wherein the cutting edge line and the rake face is smoothened by a wet blasting treatment using an $Al_2O_3$ grit.

18. The method of claim 12 wherein the first innermost layer of $TiC_xN_yO_z$ has x+y+z=1 and y>x and z is less than about 0.1.

19. The method of claim 12 wherein the layer of $TiC_xN_yO_z$ with equiaxed or plate-like grains has x+y+z=1 and z is less than about 0.5 and x>y.

20. The method of claim 12 including adding $CO_2$ and/or CO to a reaction gas to produce the layer of $TiC_xN_yO_z$ with z>0.

* * * * *